United States Patent
Chen et al.

(10) Patent No.: US 9,024,177 B2
(45) Date of Patent: May 5, 2015

(54) SOLAR CELL AND METHOD FOR MAKING THEREOF

(71) Applicant: AU Optronics Corp., Hsin-Chu (TW)

(72) Inventors: Peng Chen, Hsin-Chu (TW); Shuo-Wei Liang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/859,751

(22) Filed: Apr. 10, 2013

(65) Prior Publication Data

US 2014/0096821 A1    Apr. 10, 2014

(30) Foreign Application Priority Data

Oct. 10, 2012    (CN) .......................... 2012 1 0381952

(51) Int. Cl.
H01L 31/0352    (2006.01)
(52) U.S. Cl.
CPC ............. H01L 31/0352 (2013.01); *Y02E 10/50* (2013.01)
(58) Field of Classification Search
CPC .................................................. H01L 31/0352
USPC ................. 136/256, 255, 252; 438/72, 96, 97
See application file for complete search history.

(56) References Cited

U.S. PATENT DOCUMENTS

| | | | |
|---|---|---|---|
| 4,315,097 A * | 2/1982 | Solomon | 136/255 |
| 4,927,770 A * | 5/1990 | Swanson | 438/83 |
| 7,029,943 B2 * | 4/2006 | Kruhler | 438/57 |
| 7,339,110 B1 | 3/2008 | Mulligan | |
| 7,737,357 B2 | 6/2010 | Cousins | |
| 8,507,298 B2 * | 8/2013 | Ramappa | 438/19 |
| 8,829,339 B2 * | 9/2014 | Fogel et al. | 136/256 |
| 2004/0043528 A1 * | 3/2004 | Kruhler | 438/57 |
| 2009/0314341 A1 | 12/2009 | Borden et al. | |
| 2010/0029039 A1 | 2/2010 | Shan | |
| 2011/0000532 A1 | 1/2011 | Niira | |

FOREIGN PATENT DOCUMENTS

| | | |
|---|---|---|
| KR | 1020100128726 A | 12/2010 |
| KR | 101159276 B1 | 6/2012 |
| TW | 201019482 | 5/2010 |

* cited by examiner

*Primary Examiner* — Golam Mowla

(74) *Attorney, Agent, or Firm* — Winston Hsu; Scott Margo

(57) ABSTRACT

A solar cell includes a doped layer disposed on a first surface of a semiconductor substrate, a doped polysilicon layer disposed in a first region of a second surface of the semiconductor substrate, a doped area disposed in a second region of the second surface, and an insulating layer covering the doped polysilicon layer and the doped area. The insulating layer has openings exposing portions of the doped polysilicon layer and the doped layer, and the doped polysilicon layer and doped layer are respectively connected to a first electrode and a second electrode through the openings. The semiconductor substrate and the doped layer have a first doping type. One of the doped polysilicon layer and the doping area has a second doping type, and the other one of the doped polysilicon layer and the doping area has the first doping type which is opposite to the second doping type.

11 Claims, 14 Drawing Sheets

SOLAR CELL AND METHOD FOR MAKING THEREOF

BACKGROUND OF THE PRESENT DISCLOSURE

1. Technical Field

The present disclosure is related to a solar cell and a fabrication method thereof, and more particularly, to a solar cell and a method for making thereof with high photoelectric conversion efficiency.

2. Description of the Related Art

The energy in which human beings depend on the most is mainly generated by petroleum resources. However, since the petroleum resources on Earth are limited, the energy demands have shifted toward alternative energies dramatically in recently years. Among the alternative energy sources, solar energy shows the most promising potentials.

Due to the problems such as high cost, process complexity and poor photoelectric conversion efficiency, a breakthrough in the development of solar energy is eagerly expected. The reason causing the low photoelectric conversion efficiency includes that the metal electrode disposed on the front side of the solar cell shields a part of incident light and recombination of the minority carriers of the doped devices easily occurs. Therefore, to fabricate solar cell with high photoelectric conversion efficiency, which can replace current high pollutant and high risky energy source, is one of the most principal issue in energy industry.

SUMMARY

It is one of the objectives of the present disclosure to provide a solar cell and a method for making thereof with high photoelectric conversion efficiency by a special design of the relative arrangement and locations of the doped devices and the insulating layer(s) of the solar cell.

According to an embodiment of the present disclosure, a solar cell including a semiconductor substrate, a doped layer, a doped polysilicon layer, a doped area, an insulating layer, at least one first electrode and at least one second electrode is provided. The semiconductor substrate has a first surface and a second surface, wherein the second surface has a first region and a second region, and the semiconductor substrate has a first doping type. The doped layer is located on the first surface of the semiconductor substrate and has the first doping type. The doped polysilicon layer is disposed in the first region on the second surface of the semiconductor substrate and exposes the second region of the second surface of the semiconductor substrate. The doped area is disposed is the second region of the second surface of the semiconductor substrate, wherein one of the doped polysilicon layer and the doped area has a second doping type, the other one of the doped polysilicon layer and the doped area has the first doping type, and the second doping type is opposite to the first doping type. The insulating layer covers and is disposed on the surfaces of the doped polysilicon layer and the doped area, and has at least one first opening exposing a portion of the doped polysilicon layer and at least one second opening exposing a portion of the doped area. The first electrode is disposed on the surface of the insulating layer and connected to the doped polysilicon layer through the first opening. The second electrode is also disposed on the surface of the insulating layer and connected to the doped area through the second opening.

According to an embodiment of the present disclosure, a method for making a solar cell is further provided. First, a semiconductor substrate is provided. The semiconductor substrate has a first surface and a second surface, wherein the second surface has a first region and a second region and the semiconductor substrate has a first doping type. A doped polysilicon layer is formed in the first region on the second surface of the semiconductor substrate, wherein the doped polysilicon layer exposes the second region of the second surface of the semiconductor substrate. At least one doped area is formed in the exposed second region of the second surface of the semiconductor substrate, wherein one of the doped polysilicon layer and the doped area has a second doping type, and the other one of the doped polysilicon layer and the doped area has the first doping type. The second doping type is opposite to the first doping type. Then, an insulating layer is formed to cover and being disposed on the surface of the doped polysilicon layer and the doped area. The insulating layer has at least one first opening exposing a portion of the doped polysilicon layer and at least one second opening exposing a portion of the doped area. Following that, a metal layer is formed on the surface of the insulating layer, including at least one first electrode and at least one second electrode. The first electrode is in contact with the doped polysilicon layer through the first opening of the insulating layer, and the second electrode is in contact with the doped area through the second opening of the insulating layer. A doped layer is formed on the first surface of the semiconductor substrate, covering and being disposed on the first surface, wherein the doped layer has the first doping type.

It is an advantage that the doped polysilicon layer of the present disclosure solar cell serves as an emitter or a back surface field (BSF) device, such that the junction surface between the polysilicon and the semiconductor substrate can reduce the occurrence of the carrier recombination, thus the photoelectric conversion efficiency is further improved.

These and other objectives of the present disclosure will no doubt become obvious to those of ordinary skill in the art after reading the following detailed description of the preferred embodiment that is illustrated in the various figures and drawings.

DETAILED DESCRIPTION

To provide a better understanding of the present disclosure to the skilled users in the technology of the present disclosure, preferred embodiments will be detailed as follows. The preferred embodiments of the present disclosure are illustrated in the accompanying drawings with numbered elements to elaborate on the contents and effects to be achieved.

Figure 1:
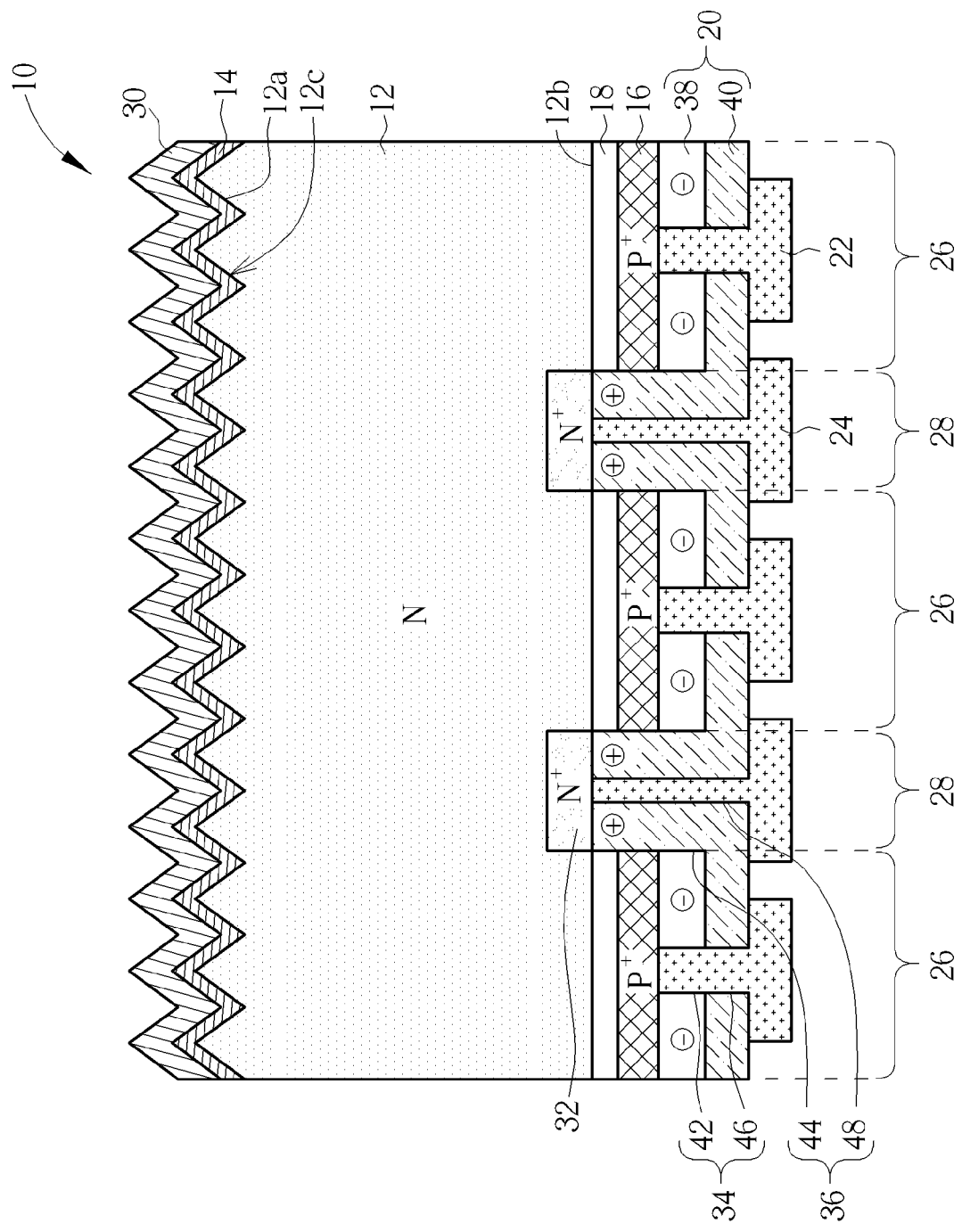
FIG. 1 to FIG. 7 are schematic diagrams of the fabrication method of a solar cell according to a first embodiment of the present disclosure.

Referring to FIG. 1, FIG. 1 is a sectional view of a solar cell according to a first embodiment of the present disclosure. In this embodiment, the present disclosure solar cell 10 is an interdigitated back contact (IBC) solar cell, including a semiconductor substrate 12, a doped layer 14, a doped polysilicon layer 16, a doped area 32, an insulating layer 20, at least one first electrode 22 and at least one second electrode 24. The semiconductor substrate (or namely semiconductor base or wafer) 12 has a first surface 12a and a second surface 12b. The first surface 12a is the light-receiving side and can be seemed as the front side of the solar cell 10, and the second surface 12b is located at the other side of the semiconductor substrate 12, opposite to the first surface 12a, wherein the second surface 12b can be seemed as the rear side of the solar cell 10. In other words, the first surface 12a and the second surface 12b of the semiconductor substrate 12 are at two different and opposite sides of the semiconductor substrate 12. The second surface 12b has a first region 26 and a second region 28 defined thereon. As shown in FIG. 1, the patterns of the first region 26 and the second region 28 are substantially arranged from left to right alternately as an example, but not limited thereto. In other embodiments, the first region 26 and the second region 28 may be arranged in a left half-part and a right half-part of the second surface 12b of the semiconductor substrate 12 respectively or in other suitable ways. The doped layer 14 is disposed on the first surface 12a of the semiconductor substrate 12, and the doped layer 14 and the semiconductor substrate 12 have the same polarity, a first doping type. The doping concentration of the doped layer 14 is preferably substantially greater than that of the semiconductor substrate 12. For example, the semiconductor substrate 12 is lightly doped, and the doped layer 14 is heavily doped, but not limited thereto. The doped polysilicon layer 16 is disposed in the first region 26 on the second surface 12b of the semiconductor substrate 12, exposing the second region 28 of the second surface 12b of the semiconductor substrate 12. The doped area (or namely doped region) 32 is disposed in the second region 28 of the second surface 12b of the semiconductor substrate 12. As shown in FIG. 1, at the side of the second surface 12b of the semiconductor substrate 12, the doped polysilicon layer 16 is disposed upon the second surface 12b, and the doped area 32 is substantially disposed underneath the second surface 12b of the semiconductor substrate 12. For example, the doped area 32 is disposed within or inside the semiconductor substrate 12 underneath the second surface 12b. The doped polysilicon layer 16 and the doped area 32 are disposed from left to right alternately as an example. One of the doped polysilicon layer 16 and the doped area 32 has the first doping type, and the other one of the doped polysilicon layer 16 and the doped area 32 has a second doping type, wherein the second doping type is opposite to the first doping type, which means the first and the second doping types have opposite polarities. The doped polysilicon layer 16 and the doped area 32 preferably have heavily doped concentrations. The insulating layer 20 is disposed on the second surface 12b of the semiconductor substrate 12, having at least one first opening 34 (three first openings 34 are shown for example) and at least one second opening 36 (two second openings 36 are shown for example) that expose a portion of the doped polysilicon layer 16 and a portion of the doped area 32 respectively. At least one first electrode 22 is disposed on the surface of the insulating layer 20 and is in contact with the doped polysilicon layer 16 through at least one first opening 34. At least one second electrode 24 is also disposed on the surface of the insulating layer 20 and is in contact with the doped area 32 through at least one second opening 36. FIG. 1 shows three first electrodes 22 and two second electrodes 24 for explanation. The first electrodes 22 and the second electrodes 24 are not connected to each other. Among the first and second electrodes 22, 24, one serves as the anode of the solar cell 10, and the other one serves as the cathode. Accordingly, both the anode and cathode of the solar cell 10 are disposed at the rear side of the solar cell 10, the second surface 12b, which is opposite to the light-receiving side, the first surface 12a.

In a preferable embodiment, the insulating layer 20 is a stacked insulating layer, including at least one first insulating layer 38 and at least one second insulating layer 40. The first insulating layer 38 covers the surface of the doped polysilicon layer 16 and has at least one first sub-opening 42 and at least one second sub-opening 44. Each first sub-opening 42 exposes a portion of the doped polysilicon layer 16, and each second sub-opening 44 exposes the doped area 32. The second insulating layer 40 covers the first insulating layer 38 and a portion of the doped area 32, and has at least one third sub-opening 46 and at least one fourth sub-opening 48. The third sub-opening 46 corresponds to the first sub-opening 42, and the fourth sub-opening 48 corresponds to the second sub-opening 48. Therefore, each third sub-opening 46 exposes a portion of the doped polysilicon layer 16, and each fourth sub-opening 48 exposes a portion of the doped area 32. As shown in FIG. 1, the first opening 34 of the insulating layer 20 is composed of the first sub-opening 42 of the first insulating layer 38 and the third sub-opening 46 of the second insulating layer 40, and the second opening 36 of the insulating layer 20 is composed of the second sub-opening 44 of the first insulating layer 38 and the fourth sub-opening 48 of the second insulating layer 40. For instance, the first insulating layer 38 and the second insulating layer 40 are composed of different materials in this embodiment. Preferably, the polarity of the fixed oxide charge (FOC, Qf) of the first insulating layer 38 is opposite to that of the second insulating layer 40. More preferably, the polarity of the FOC of the first insulating layer 38 is opposite to the doping polarity of the doped polysilicon layer 16, and the polarity of the FOC of the second insulating layer 40 is opposite to the doping polarity of the doped area 32. Accordingly, the first insulating layer 38 and the second insulating layer 40 provide field effect passivation functionality to the minority carriers of the doped polysilicon layer 16 and the doped area 32 respectively, so as to prevent the minority carriers from recombining. However, the polarities of the FOC and the doping polarity are not limited by this embodiment. In this embodiment, the polarities of the FOC of the first insulating layer 38 and the second insulating layer 40 may be designed by way of determining the materials of the first insulating layer 38 and the second insulating layer 40. For example, in one aspect, for designing one of the first insulating layer 38 and the second insulating layer 40 has positive type of FOC, silicon oxide ($SiO_x$), silicon nitride ($SiN_x$), silicon oxynitride (SiON), yttrium oxide ($YO_x$), other suitable materials, or a combination of at least two of the above materials can be adopted. In another aspect, aluminum oxide ($AlO_x$), aluminum nitride ($AlN_x$), aluminum oxynitride (AlON), aluminum fluoride ($AlF_x$), hafnium oxide ($HfO_x$), nitrogen-doped $HfO_x$, other suitable materials, or a combination of at least two of the above materials can be adopted to form the other one of the first insulating layer 38 and the second insulating layer 40 to provide the negative type of the FOC. However, the materials of the first insulating layer 38 and the second insulating layer 40 are not limited by the above-mentioned materials.

According to this embodiment, the polarities of the doping types of the semiconductor substrate 12, the doped layer 14, the doped polysilicon layer 16, and the doped area 32 and the polarities of the FOC of the first insulating layer 38 and the second insulating layer 40 are described in the following for explanation as examples. For instance, in a preferable embodiment of the present disclosure, the semiconductor substrate 12 has N type (or namely negative type), the doped layer 14 has $N^+$ type, the doped polysilicon layer 16 has $P^+$ type, and the doped area 32 has N+ type. The fabrication method of the solar cell 10 including the doped devices with the aforementioned doping types according to the first embodiment of the present disclosure will be detailed explained in later paragraphs, as shown in FIG. 1. In order to enable the first insulating layer 38 and the second insulating layer 40 to provide field effect passivation functionalities, the first insulating layer 38 has negative type of FOC, contrary to the doping type of the doped polysilicon layer 16, and the second insulating layer 40 has positive type of FOC contrary to the doping type of the doped area 32. In a preferable embodiment, the solar cell 10 may selectively include an oxide layer 18 disposed in the first region 26 on the second surface 12b of the semiconductor substrate 12, between the second region 28 of the semiconductor substrate 12, the doped polysilicon layer 16 and the semiconductor substrate 12. The oxide layer 18 may serve as a tunnel oxide layer of the solar cell 10. Generally, the oxide layer 18 is thin enough such that probability of the electrons directly passing through the oxide layer 18 can be raised, so as to increase the photoelectric conversion efficiency. The thickness of the oxide layer 18 may be about 5 angstroms to about 20 angstroms (Å). In some embodiments, the thickness of the oxide layer 18 may be about 10 Å, preferably about 15 Å. A structure similar to a heterojunction is provided by the doped polysilicon layer 16 with P+ type, the tunnel oxide layer 18 and the semiconductor substrate 12 with N type, and therefore the saturation current or recombination current can be effectively lowered and the photoelectric conversion efficiency can be effectively raised. In addition, since the doping polarities of the doped layer 14 and the doped area 32 are the same as the semiconductor substrate 12, the doped layer 14 serves as the front side field (FSF) device, and the doped area 32 serves as the back side field (BSF) device. Furthermore, the P+ doped polysilicon layer 16 serves as the emitter of the solar cell 10.

In another preferable embodiment of the present disclosure, the semiconductor substrate 12 has P type (or namely positive type), the doped layer 14 has P+ type (or namely positive type has high concentration), the doped polysilicon layer 16 has N+ type (or namely negative type has high concentration), and the doped area 32 has P+ type. Furthermore, the first insulating layer 38 has positive type of FOC, and the second insulating layer 40 has negative type of FOC. In this situation, the doped polysilicon layer 16 serves as the emitter of the solar cell 10, and the solar cell 10 can have good photoelectric conversion efficiency because the semiconductor substrate 12 and the doped polysilicon layer 16 have a PN junction therebetween. In addition, in other embodiments, it is capable that the semiconductor substrate 12 has N type, the doped layer 14 has N+ type, the doped polysilicon layer 16 has N+ type, the doped area 32 has P+ type, the first insulating layer 38 has positive type of FOC, and the second insulating layer 40 has negative type of FOC. As a result, the doped polysilicon layer 16 serves as the BSF device, the doped area 32 serves as the emitter, and the doped layer 14 serves as the FSF device of the solar cell 10. In still another embodiment, the semiconductor substrate 12 has P type, the doped layer 14 has P+ type, the doped polysilicon layer 16 has P+ type, the doped area 32 has N+ type, the first insulating layer 38 has negative type of FOC, and the second insulating layer 40 has positive type of FOC. In this situation, the doped polysilicon layer 16 serves as the BSF device, the doped area 32 serves as the emitter, and the doped layer 14 serves as the FSF device. However, the relative relationships between the polarities of FOC of the first insulating layer 38 and the second insulating layer 40 and the doping types of the various doped devices of the present disclosure are not limited by the above embodiments.

In addition, the solar cell 10 of this embodiment may selectively include an anti-reflection coating (ARC) layer 30 disposed on the surface of the doped layer 14, but not limited thereto. The ARC layer 30 may be only a single layer or include multi layers, with a material including silicon nitride (SiN), silicon oxide (SiO), silicon oxynitride (SiON), zinc oxide, titanium oxide, indium tin oxide (ITO), indium oxide, bismuth oxide, stannic oxide, zirconium oxide, hafnium oxide, antimony oxide, gadolinium oxide, etc., or other suitable materials, or a mixture of at least two of the aforementioned materials, but not limited thereto. Furthermore, in order to increase the total amount of light entering the solar cell 10, the interface of the semiconductor substrate 12 and the doped layer 14 can be selectively textured. For example, the first surface 12a may have, but not limited to, a texture structure 12c for further increasing the photoelectric conversion efficiency.

Figure 2:
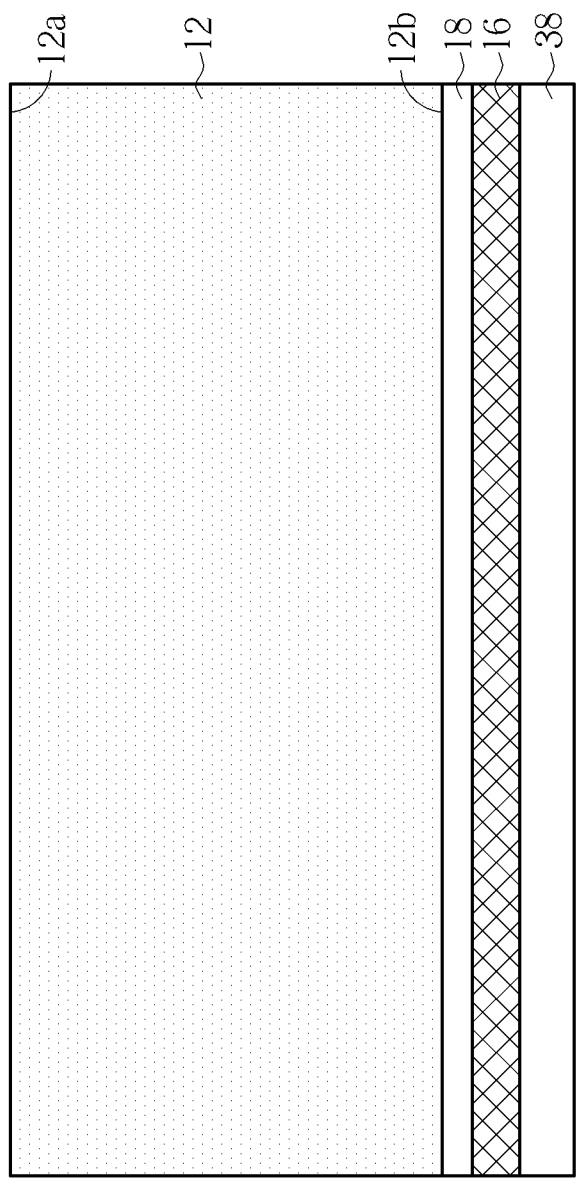

The fabrication method of the solar cell of the first embodiment of the present disclosure will be explained in the following paragraphs. To simplify the description, the identical components are marked with identical symbols. FIG. 2 to FIG. 7 are schematic diagrams of the fabrication method of the solar cell according to a first embodiment of the present disclosure. Referring to FIG. 2, first, a semiconductor substrate 12 is provided, which may be a crystalline semiconductor substrate or a polycrystalline semiconductor substrate. The thickness of the semiconductor substrate 12 is about 50 micrometers (μm) to about 300 μm for instance. The semiconductor substrate 12 preferably has a first doping type. In this embodiment, the semiconductor substrate 12 is N-type doped substrate as an example. Selectively, a cleaning process may be carried out to the semiconductor substrate 12, and the damage of the substrate is sawed. Then, a thin oxide layer 18 for serving as the tunnel oxide layer can be selectively formed on the surface 12b of the semiconductor substrate 12, whose thickness is about 5 angstroms (Å) to about 20 Å, preferable about 15 Å. For instance, the oxide layer 18 may include silicon oxide, and may be formed by an ozone oxidation process or a high temperature oxidation, but not limited thereto. A doped polysilicon layer 16 may be formed on the surface of the oxide layer 18, with a thickness of about 50 nanometers to about 500 nanometers (nm), but not limited thereto. The doped polysilicon layer 16 may include the first doping type or the second doping type. Preferably, the doped polysilicon layer 16 has the second doping type, whose polarity is opposite to the semiconductor substrate 12 with the first doping type. For instance, the doped polysilicon layer 16 has P+ type, preferably with a doping concentration of about $10^{19}$ to about $10^{21}$ atom/cm$^2$, but not limited thereto. The formation processes of the doped polysilicon layer 16 may include forming a polysilicon layer on the surface of the oxide layer 18 through a chemical vapor deposition (CVD) process, and then performing an ion implanting process, as an example. The doped polysilicon layer 16 of this embodiment has P+ type and includes P type dopants, such as boron or boron-containing compounds, but not limited thereto. The doped polysilicon layer 16 may also be fabricated by a low pressure chemical vapor deposition (LPCVD) process to directly form the P+ doped polysilicon layer 16, or by forming an amorphous silicon layer, then re-crystallizing the amorphous silicon layer to form a polysilicon layer by a laser annealing process, and then performing an ion implanting process. However, the formation method of the doped polysilicon layer 16 is not limited by the aforementioned processes.

Then, a first insulating layer 38 is selectively formed on the surface of the doped polysilicon layer 16. In order to provide field effect passivation functionality to the minority carriers of the doped polysilicon layer 16, the first insulating layer 38 should has opposite polarity of FOC to the conductivity type of the doped polysilicon layer 16. For example, if the doped polysilicon layer 16 has P+ type, the first insulating layer 38 of this embodiment preferably has negative type of FOC. In this situation, the first insulating layer 38 may include material (s) mentioned in previous paragraphs. In this embodiment, the first insulating layer 38 may include aluminum oxide as an example, such as $Al_2O_3$, but not limited thereto. In contrary, if the doped polysilicon layer 16 has N+ type, the first insulating layer 38 of this embodiment preferably has positive type of FOC, and the first insulating layer 38 may include material(s) mentioned in the former paragraphs. For example, silicon oxide, such as SiO2, may be adopted in this embodiment, but not limited thereto. The thickness of the first insulating layer 38 may be about 20 nm to about 400 nm, but not limited thereto. In other embodiments of the present disclosure, the first insulating layer 38 may be omitted.

Figure 3:
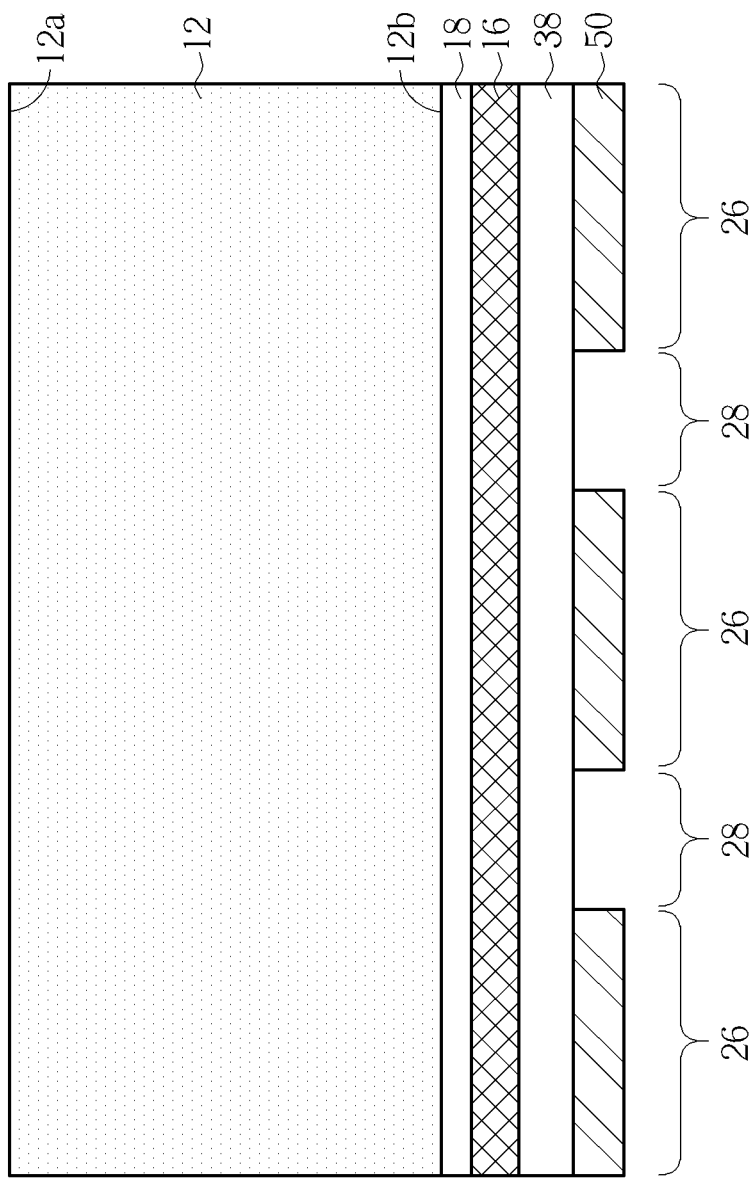
Figure 4:
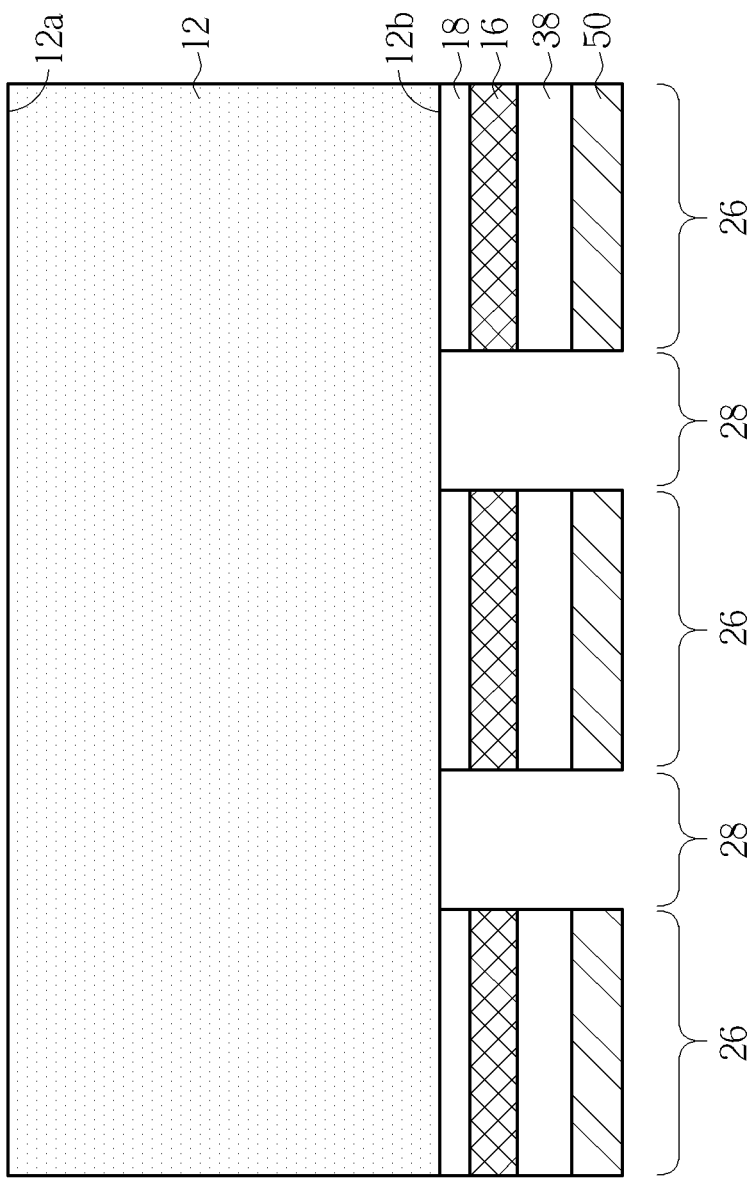

Referring to FIG. 3, a patterning process to the oxide layer 18, the doped polysilicon layer 16 and the first insulating layer 38 is then performed. For example, a screen printing mask 50 or a photoresist mask may be formed on the first insulating layer 38 to define the pattern of the first insulating layer 38 predetermined to be remained, which is the first region 26 of the second surface 12b of the semiconductor substrate 12. Therefore, the pattern of the mask exposes the portion of the first insulating layer 38 in the predetermined second region 28 of the second surface 12b. If the photoresist mask is adopted, it can be formed by a lithography process and a development process, or by an inkjet coating process. Then, as shown in FIG. 4, the portions of the first insulating layer 38, the doped polysilicon layer 16 and the oxide layer 18 exposed by the screen printing mask 50 or the photoresist mask are removed by a wet etching process or a dry etching process for example, preferable a wet etching process, wherein a wet etchant such as a mixture solution of HF and $HNO_3$ can be used. In addition, the removing process can be carried out through one step or through several steps. For instance, the removed portions of the first insulating layer 38, the doped polysilicon layer 16 and the oxide layer 18 can be individually removed in different removing steps, but not limited thereto. The patterning process of the first insulating layer 38, the doped polysilicon layer 16 and the oxide layer 18 may also be performed through a laser process, but not limited thereto. After the removing process, the remaining first insulating layer 38, doped polysilicon layer 16 and oxide layer 18 are disposed within the first region 26 on the second surface 12b of the semiconductor substrate 12, exposing the second region 28 of the second surface 12b of the semiconductor substrate 12. The second region 28 of the second surface 12b may include a pattern with a plurality of dots, strips or other suitable patterns. As shown in FIG. 4, after the patterning process, the remaining oxide layer 18 is disposed between the second surface 12b within the first region 26 and the doped polysilicon layer 16. Noted that the exposed portion of the surface 12b of the semiconductor substrate 12 in the second region 28 can be further removed after removing the exposed oxide layer 18, and therefore some trenches may be formed in the semiconductor substrate 12 within the second region 28. The depth of the trenches may be about 0 um to about 10 μm, but not limited thereto. Taking the depth with 0 μm as an example in this embodiment, the patterning process is stopped when the oxide layer 18 in the second region 28 is removed, wherein no trench is formed in the semiconductor substrate 12.

Figure 5:
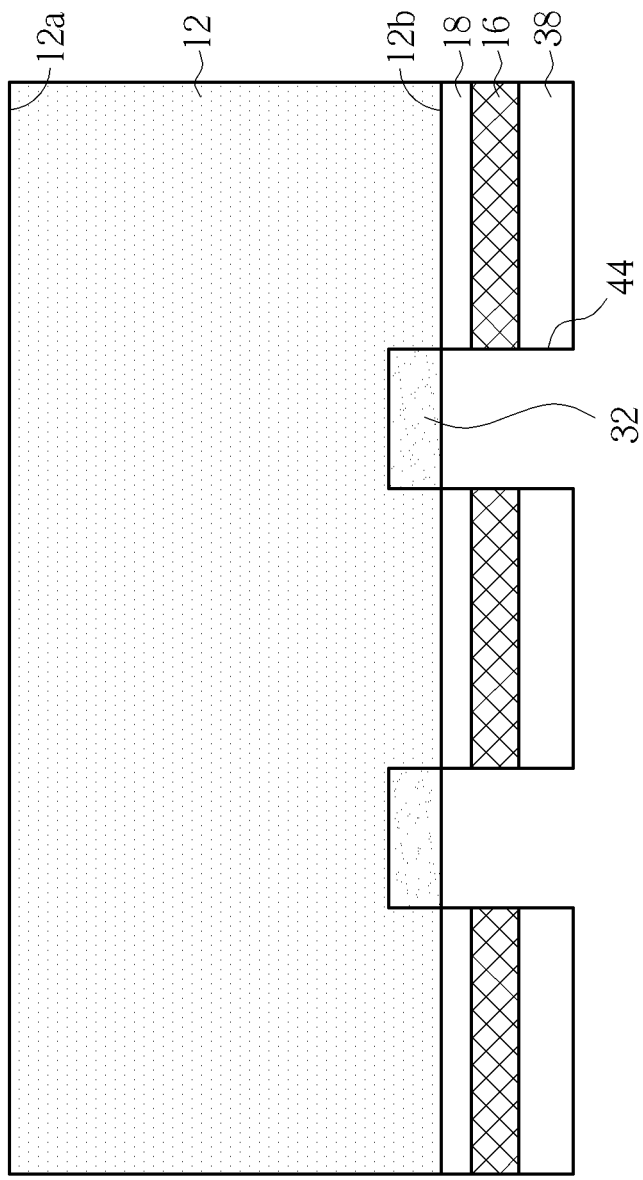

After that, referring to FIG. 5, the screen printing mask 50 is removed. A doped area 12 is formed in the second region 28, the exposed second surface 12b of the semiconductor substrate 12. In this embodiment, the doped area 12 has a first doping type, such as N+ type, whose polarity is opposite to the doping polarity of the doped polysilicon layer 16. The formation of the doped area 32 may include taking the first insulating layer 38 as an mask to perform an ion implanting process to the second surface 12b of the semiconductor substrate 12 and performing an annealing process or a thermal diffusion process to form the doped area 32, wherein the first insulating layer 38 has the second sub-openings 44 that exposes the second region 28 of the second surface 12b. The doped area 32 can be formed by other ways, such as through a thermal diffusion process to directly diffuse dopants into the second region of the semiconductor substrate 12, or through an ion shower doping process to enable the do pants to enter the second region 28 of the semiconductor substrate 12, but not limited thereto. The N+ dopants may be, for example, phosphorous, arsenic, antimony, or compound(s) of the above materials, but not limited thereto. The depth of the doped area 12 is about 0.5 m to about 1 μm, and the doping concentration is about $10^{19}$ to about $10^{21}$ atom/$cm^2$ as an example, but not limited thereto.

Figure 6:
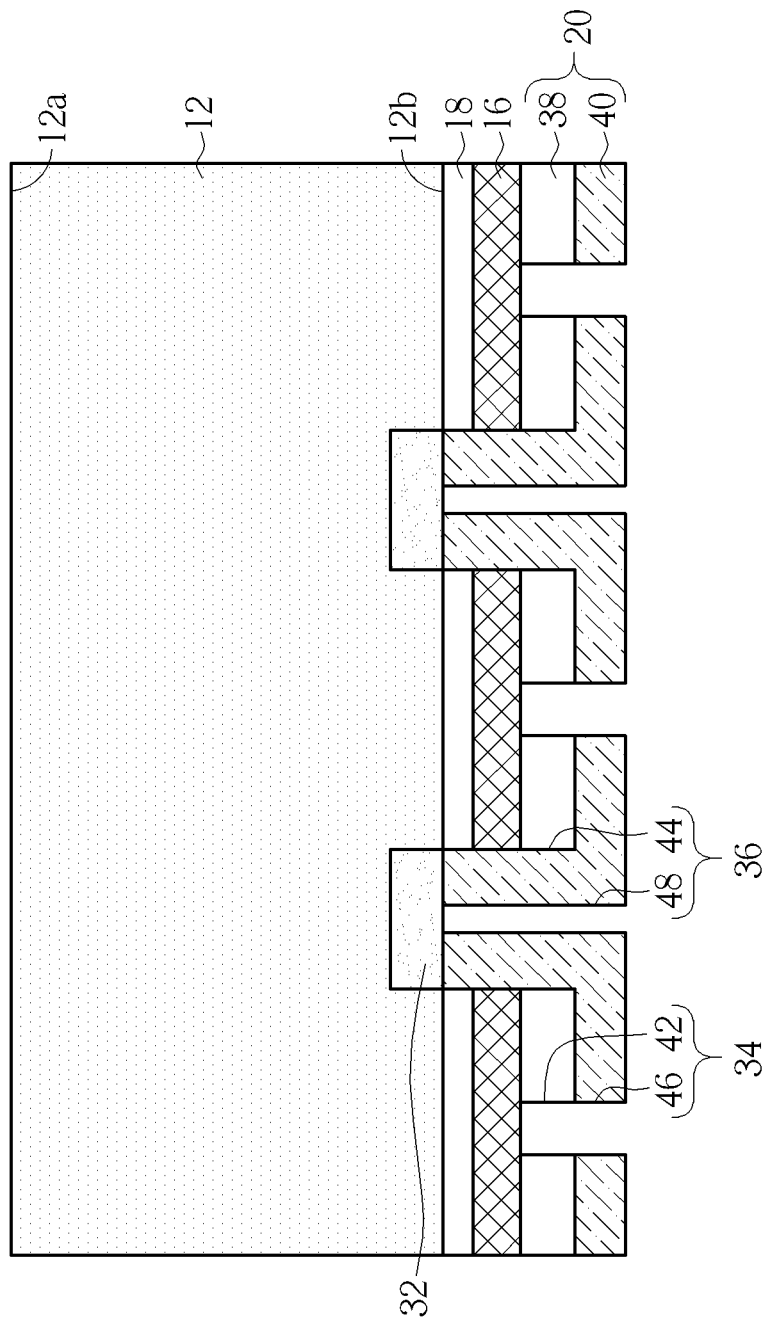

Sequentially, as shown in FIG. 6, a second insulating layer 40 is blanketly formed (or namely fully formed) on the second surface 12ba of the semiconductor substrate 12, covering on the first insulating layer 38 and the doped area 32. In order to provide field effect passivation functionality to the minority carriers of the doped area 32, the material of the second insulating layer 40 is selected in accordance with the polarities of the doped polysilicon layer 16 and the doped area 32 in this embodiment, which determines the polarity of FOC of the second insulating layer 40. For example, the second insulating layer 40 preferably has positive type of FOC when the doped polysilicon layer 16 has P+ type, the doped area 32 has $N^+$ type, and the first insulating layer 38 has negative type of FOC. In this situation, the second insulating layer 40 may include material(s) mentioned the former paragraphs, such as silicon oxide and silicon nitride, but not limited thereto. In contrary, the second insulating layer 40 preferably has negative type of FOC when the doped polysilicon layer 16 has N+ type, the doped area 32 has $P^+$ type, and the first insulating layer 38 has positive type of FOC. The material with negative type of FOC of the second insulating layer 40 has been mentioned in former paragraphs, such as aluminum oxide, but not limited thereto. The thickness of the second insulating layer 40 may be about 20 nm to about 400 nm, but not limited thereto. Then, a patterning process to the second insulating layer 40 and the first insulating layer 38 is carried out. In this patterning process, portions of the second insulating layer 40 and the first insulating layer 38 are removed to form the first sub-openings 42 in the first insulating layer 38 and the third sub-openings 46 and the fourth sub-openings 48 in the second insulating layer 40, exposing a portion of the doped polysilicon layer 16 and a portion of the doped area 32. The patterning process may be carried out by using a screen printing mask to define the locations of the third sub-openings 46 and the fourth sub-openings 48 on the second insulating layer 40 and then removing the exposed portions of the second insulating layer 40 and the exposed portions of the first insulating layer 38 with one or more etching processes. In other embodiments, a photolithography-etching process or a photoresist mask may also be adopted for accomplishing the patterning process, but not limited thereto. As shown in FIG. 6, each third sub-opening 46 is corresponding to one first sub-opening 42, composing the first opening 34 of the insulating layer 20 and exposing a portion of the doped polysilicon layer 16, and each fourth sub-opening 48 is corresponding to one second sub-opening 44, composing the second opening 36 of the insulating layer 20 and exposing a portion of the doped area 32. In other embodiments, the first sub-opening 42 may be formed in the first insulating layer 38 before forming the second insulating layer 40, and then the third sub-openings 46 and the fourth sub-openings 48 are formed after the second insulating layer 40 is formed on the first insulating layer 38 with the first sub-openings 42.

Figure 7:
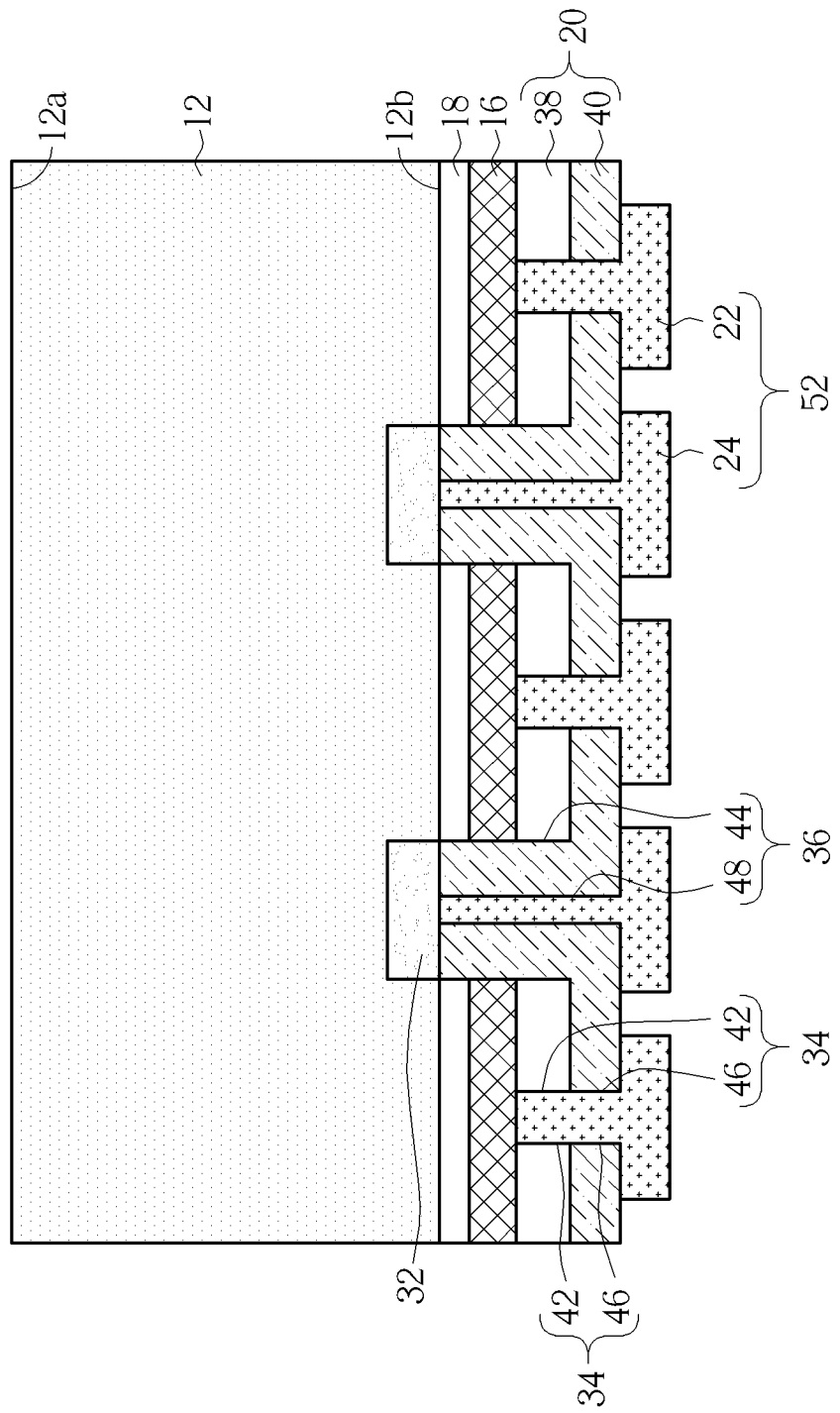

Referring to FIG. 7, a metal layer 52 is blanketly formed (or namely fully formed) on the second surface 12ba of the semiconductor substrate 12, which may be formed with good electric conductivity, such as aluminum, silver, platinum, gold, copper, alloy of the above materials, or other suitable materials, but not limited thereto. Following that, a patterning process to the metal layer 52 is performed to remove a portion of the metal layer 52 for forming at least one first electrode 22 and at least one second electrode 24, wherein the first electrode 22 and the second electrode 24 are connected to the doped polysilicon layer 16 and the doped area 32 through the first openings 34 and the second openings 36 of the insulating layer 20 respectively. However, the first electrode 22 and the second electrode 24 may be formed through a method of coating conductive adhesive on the second insulating layer 40, wherein the conductive adhesive may include material(s) of aluminum, silver, nickel, copper, alloy of the above materials, or other suitable materials, but not limited thereto. The method of coating the conductive adhesive maybe screen printing, inkjet printing, or other suitable process. The thicknesses, areas and patterns of the first electrode 22 and the second electrode 24 can be adjusted in various designs and are not limited by the disclosure of FIG. 7.

Referring back to FIG. 1, a texturing treatment to the first surface 12a of the semiconductor substrate 12 is selectively performed. Then, a doped layer 14 is formed in the first surface 12a, wherein the doped layer 14 has a first doping type the same as the polarity of the doping type of the semiconductor substrate 12. For example, the doped layer 14 has heavy N+ type, and may be formed by the same process as the doped area 32 mentioned in the former paragraphs, such as diffusing dopants into the first surface 12a of the semiconductor substrate 12 by an external ion diffusion process, but not limited thereto. In addition, the dopants of the doped layer 14 maybe similar to that of the doped area 32, thus the details of the materials will not be described herein. In other embodiments, the doped layer 14 maybe an extra doped layer which is further formed on the first surface 12a of the semiconductor substrate 12, such as a doped amorphous silicon layer, a crystalline silicon layer, or a polysilicon layer, but not limited thereto. Finally, an ARC layer 30 is selectively formed on the doped layer 14 blanketly (or namely fully), covering the first surface 12a of the semiconductor substrate 12, wherein the ARC layer 30 may be a single layer or multi layers, and includes the materials mentioned in the above descriptions describing FIG. 1. Accordingly, the main structure of the present disclosure solar cell 10 is accomplished.

It is noteworthy that the doping types of the doped devices or layers and the FOC polarities of the first and second insulating layers of the present disclosure solar cell should not be limited by the disclosure of FIG. 1, and the dopants of the doped devices or layers and the oxide materials of the insulating layers are selected in accordance with the designed doping types and FOC polarities respectively, as mentioned in former paragraphs. In addition, although the devices on the rear side of the solar cell are formed before forming the devices on the front side in the first embodiment, the formation order is not limited by this embodiment. For example, in some embodiments, the devices on the front sides of the solar cell, such as the doped layer and ARC layer, maybe formed before the devices on the rear side of the solar cell, such as the oxide layer, the doped polysilicon layer, the doped area, the insulating layer, the first electrode and the second electrode. In even other embodiments, it is not limited that the formations of the devices of one side of the solar cell have to be all finished before forming the devices on the other side. In contrary, the devices on the first surface and second surface of the semiconductor substrate may be formed with various orders or be formed alternately, which means the formation sequence of the devices on two sides of the semiconductor substrate is not limited by the present disclosure.

The solar cell and the fabrication method thereof are not limited by the aforementioned embodiment, and may have other different preferred embodiments and variant embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 8:
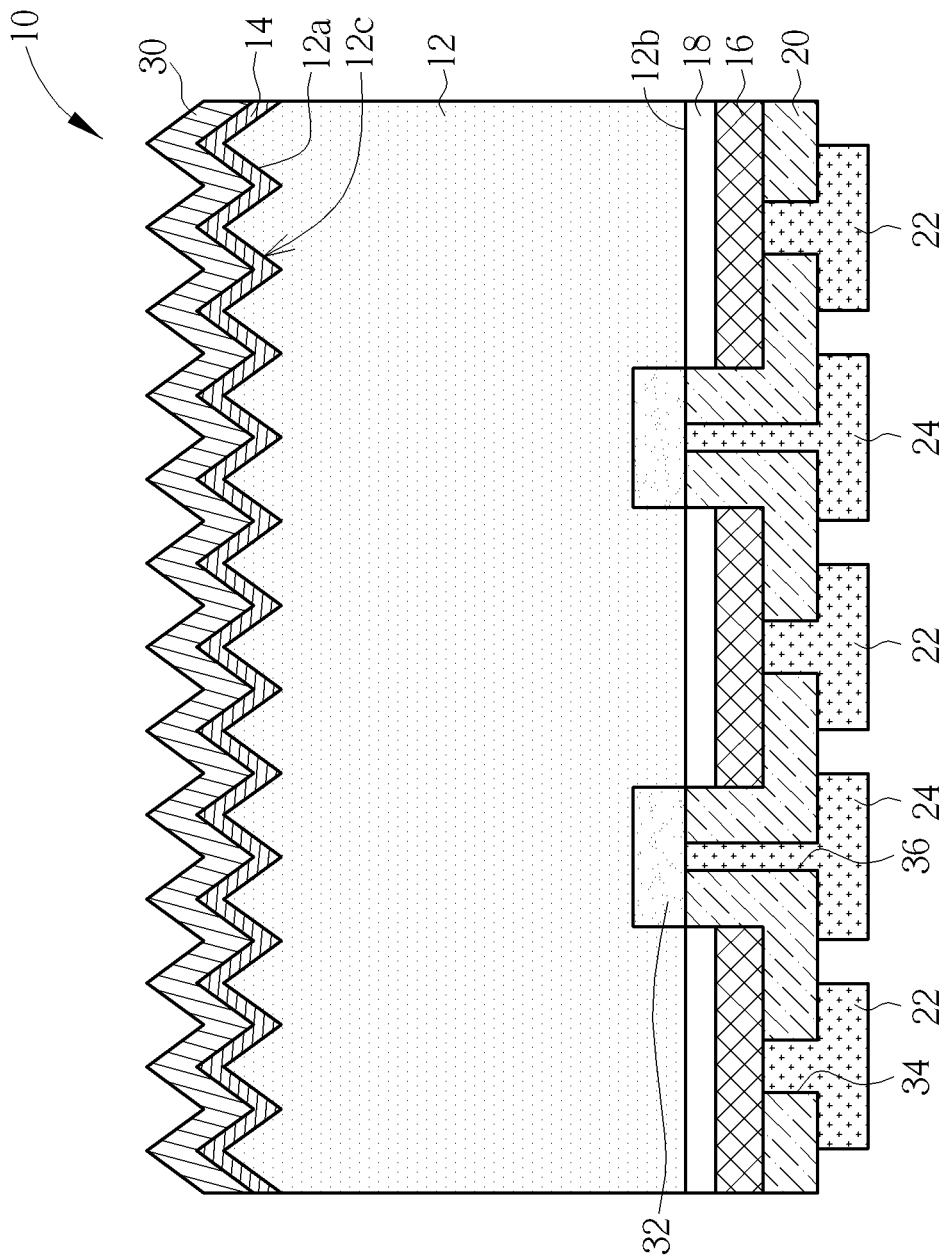
FIG. 8 is a sectional schematic diagram of a solar cell according to a second embodiment of the present disclosure.

Referring to FIG. 8, FIG. 8 is a schematic diagram of the solar cell according to the second embodiment of the present disclosure. Different from the first embodiment, the solar cell 10 of this embodiment only has one single insulating layer 20, with at least one first opening 34 exposing a portion of the doped polysilicon layer 16 and at least one second opening 36 exposing a portion of the doped area 32, such that the first electrode 22 and the second electrode 24 can be electrically connected to the doped polysilicon layer 16 and the doped area 32 through the first opening 34 and the second opening 36 respectively. In order to serve as a passivation layer, the material of the insulating layer 20 can be selected optionally. Taking the doped polysilicon layer 16 with $P^+$ doping type and the doped area 32 with $N^+$ doping type as an example, if the insulating layer 20 is designed to solve the problem of high saturation current of the doped polysilicon layer 16, the material with negative type of FOC may be used to form the insulating layer 20; alternatively, if the insulating layer 20 is designed to solve the problem of high saturation current of the doped area 32, the material with positive type of FOC maybe used for forming the insulating layer 20. In another aspect, in the example that the doped polysilicon layer 16 has N+ type and the doped area 32 has P+ type, a material with positive type of FOC for the insulating layer 20 can be used if the saturation current of the doped polysilicon layer 16 with N+ type is the main problem to be improved; and the material with negative type of FOC of the insulating layer 20 can be used if the saturation current of the doped area 32 with P+ type needs to be improved. The materials with positive or negative types of FOC have been introduced in the related description in the first embodiment of FIG. 1. No details will be repeated herein. The fabrication method of the solar cell 10 of this embodiment is similar to the first embodiment, only that the formation of the first insulating layer is omitted. The patterning process to the doped polysilicon layer 16 and the oxide layer 18 is carried out right after forming the doped polysilicon layer 16, to expose the semiconductor substrate 12 within the second region 28. The insulating layer 20 is formed after the doped area 32 and is then patterned to form the first opening 34 and the second opening 36, wherein the thickness of the insulating layer 20 may be about 20 nm to about 500 nm. The details of the formation processes of each device of the solar cell 10 will not be repeated herein.

Figure 9:
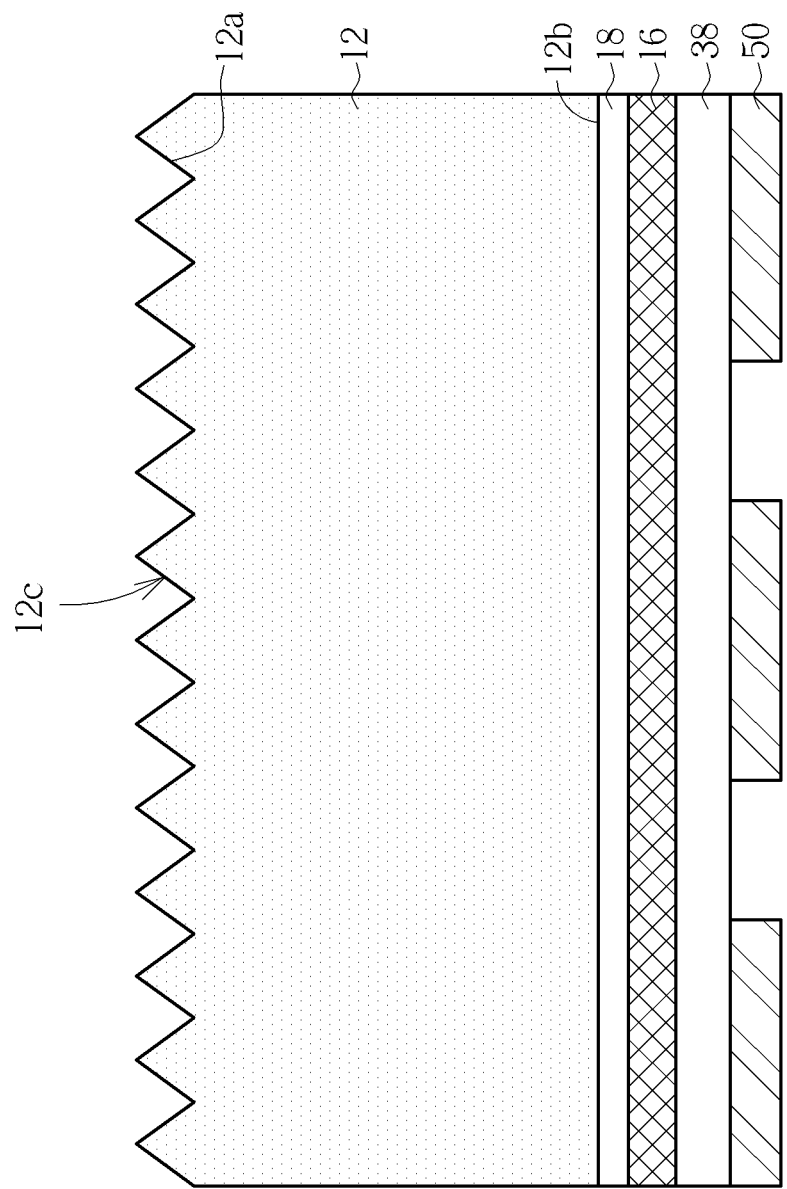
FIG. 9 to FIG. 13 are schematic diagrams of the fabrication method of a solar cell according to a third embodiment of the present disclosure.
Figure 10:
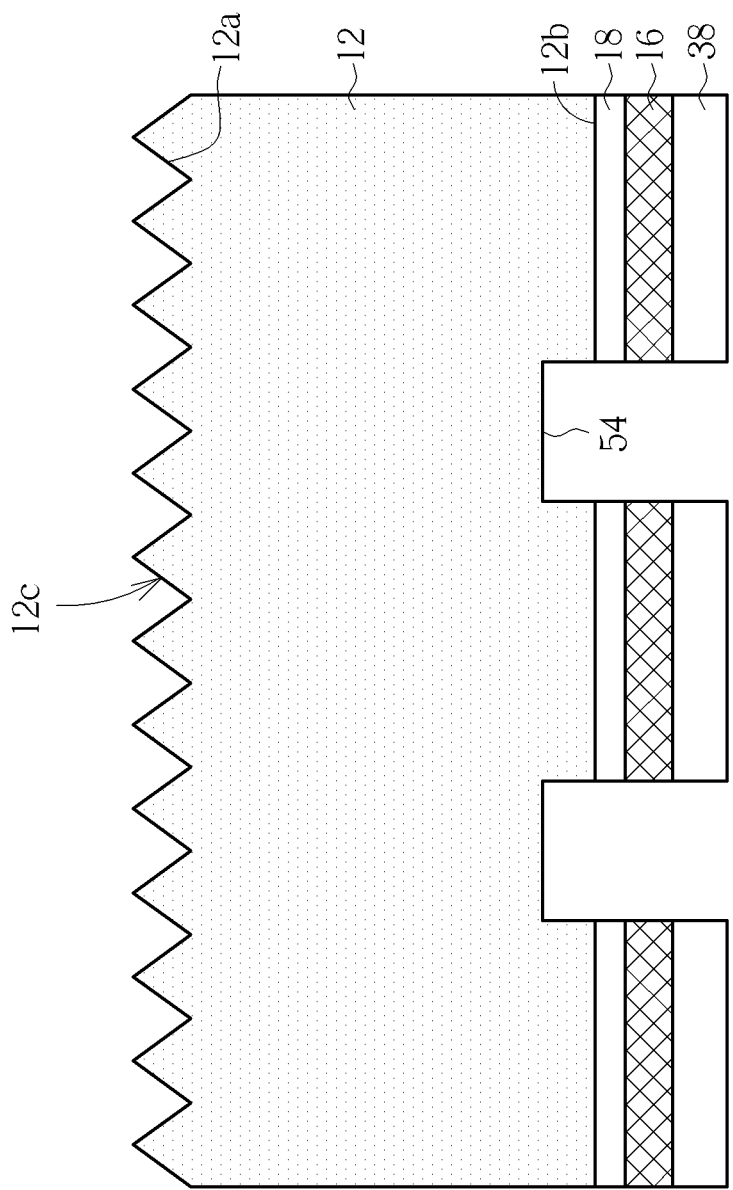
Figure 11:
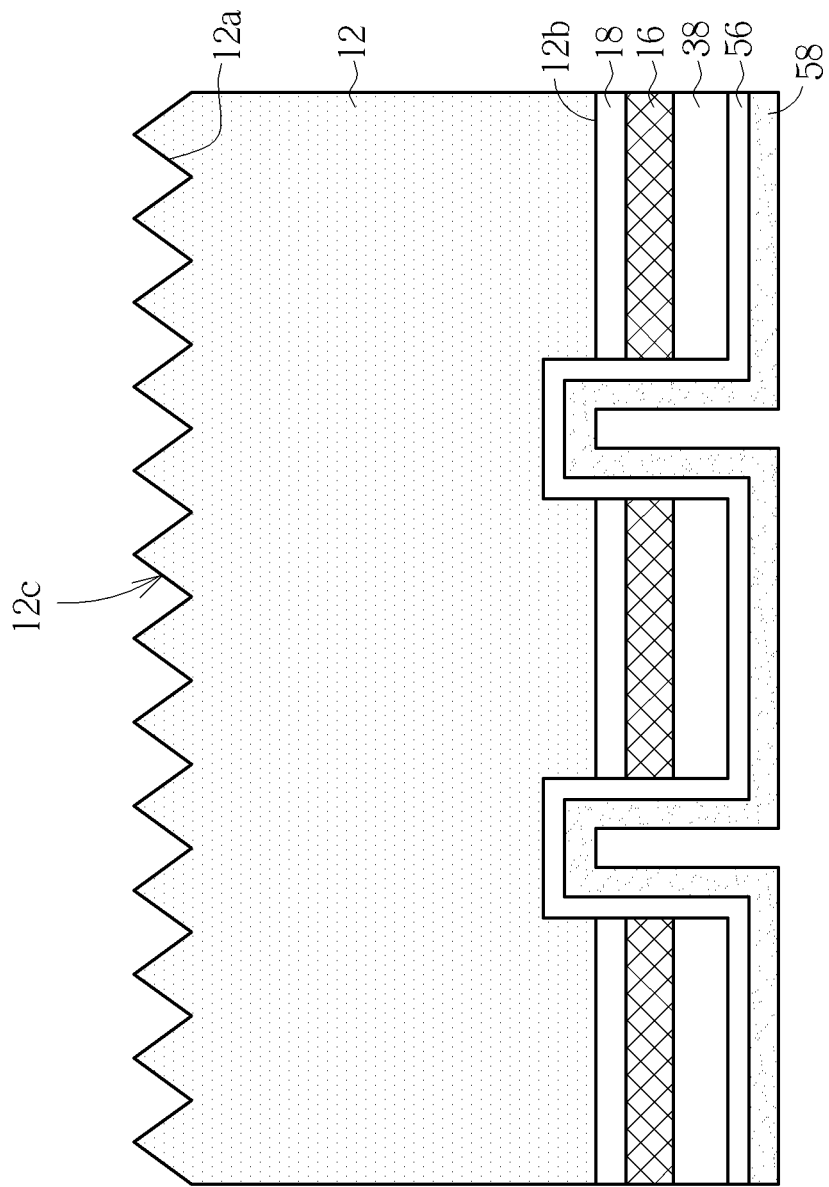
Figure 12:
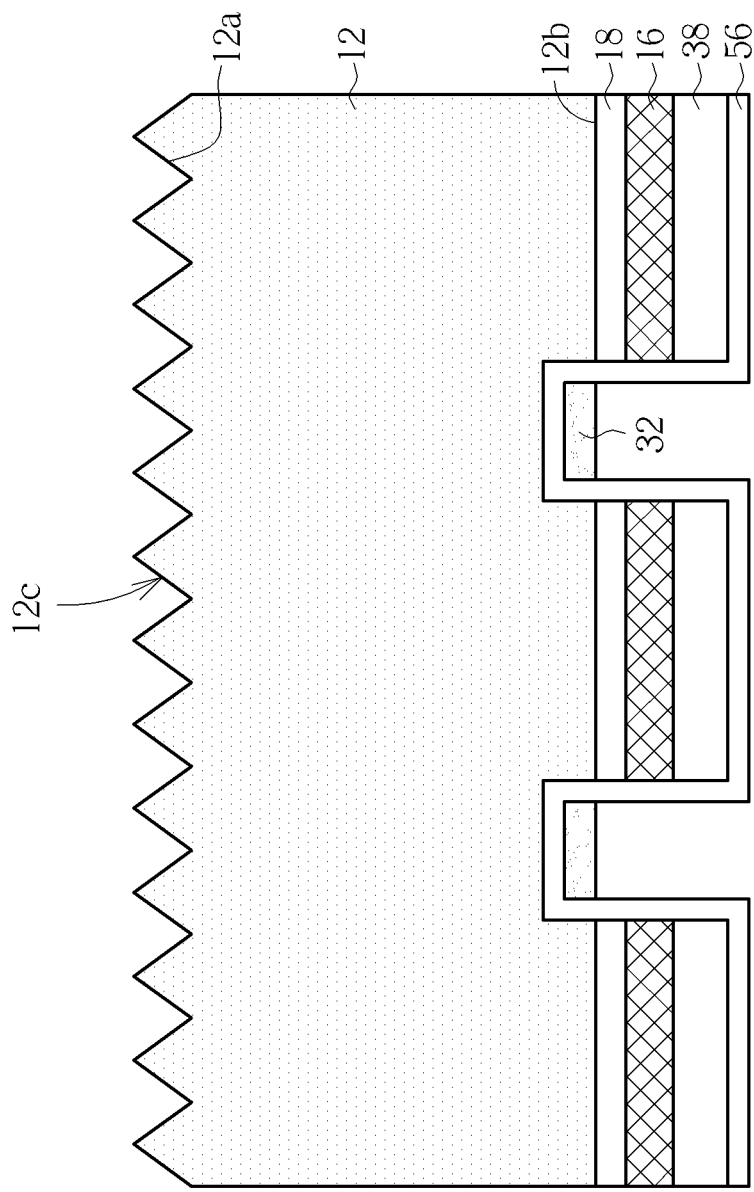
Figure 13:
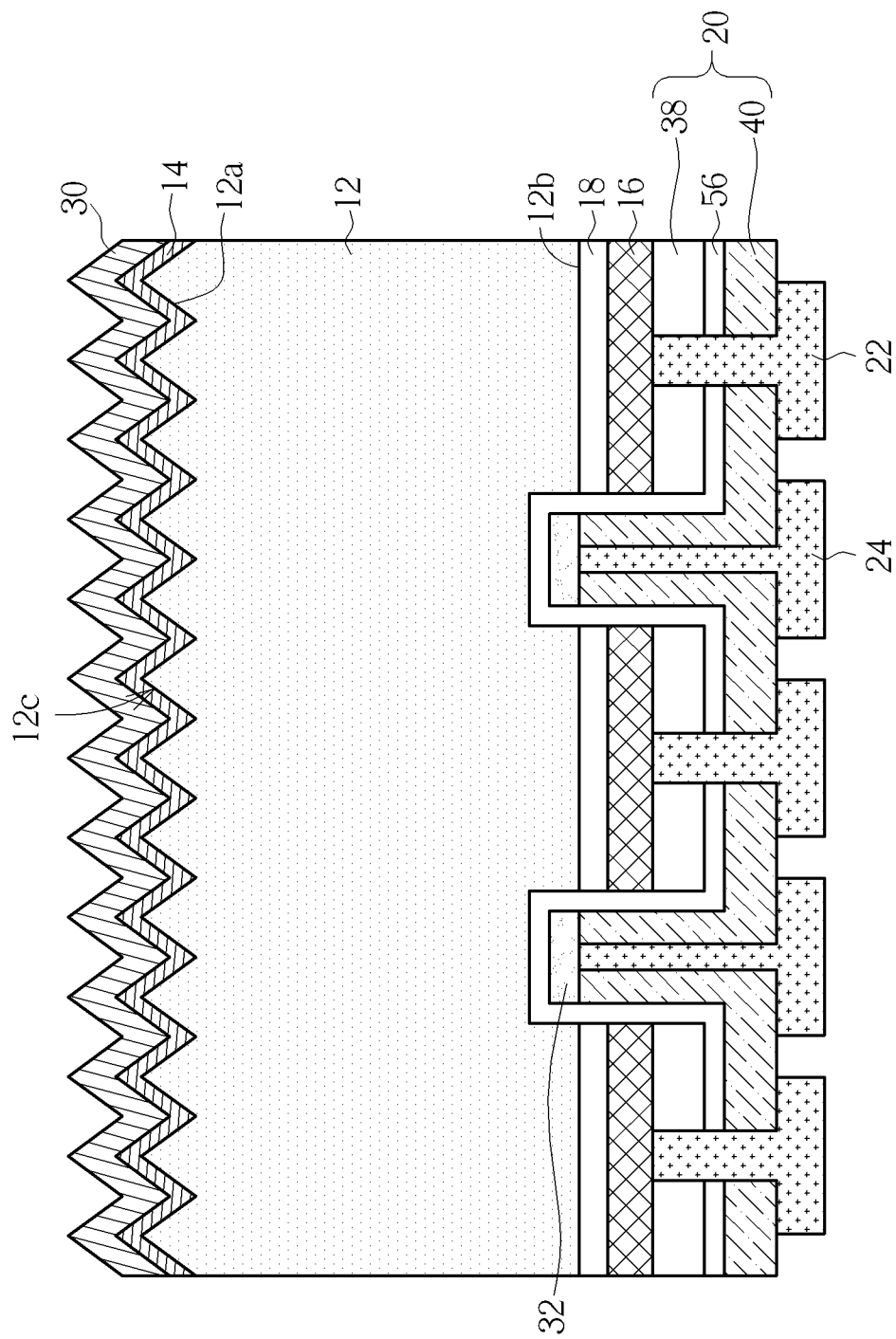

Referring to FIG. 9 to FIG. 13, FIG. 9 to FIG. 13 are schematic diagrams of the fabrication method of a solar cell according to a third embodiment of the present disclosure, wherein the sectional view of the structure of the solar cell of the third embodiment of the present disclosure is shown in FIG. 13. In this embodiment, as shown in FIG. 9, a texturing treatment is first performed to the first surface 12a of the semiconductor substrate 12 to enable the first surface 12a to have a texture structure 12c, and then the formations of the device on the second surface 12b are carried out. Similar to the processes disclosed in FIG. 2 to FIG. 3 of the first embodiment, the oxide layer 18, the doped polysilicon layer 16 and the first insulating layer 38 are successively formed on the second surface 12b of the semiconductor substrate 12 and are patterned by using a screen printing mask 50 as the etching mask and performing an etching process to remove the exposed oxide layer 18, doped polysilicon layer 16, first insulating layer 38 and the second surface 12b of the semiconductor substrate 12 within the second region 28, as shown in FIG. 10. The etching process is continued to remove a portion of the second surface 12b of the semiconductor substrate 12 after finishing removing the exposed oxide layer 18, so as to form the trenches 54 on the second surface 12b within the second region 28. The depth of the trenches 54 may be larger than 0 μm and less than or equal to about 10 μm. Then, an annealing process is carried out.

Referring to FIG. 11, an amorphous silicon layer 56 is selectively formed at the second surface 12b of the semiconductor substrate 12. The amorphous silicon layer 56 is preferable an intrinsic amorphous silicon layer. Then, a doped amorphous silicon layer 58 is formed on the intrinsic amorphous silicon layer 56. The amorphous silicon layer 56 and the doped amorphous silicon layer 58 cover the second surface 12b of the semiconductor substrate 12 and fill the trenches 54. The formations of the intrinsic amorphous silicon layer 56 and the doped amorphous silicon layer 58 may include, but not limited to, performing a CVD process to deposit an amorphous silicon layer, and performing an ion implanting process or an ion shower doping process to form the doped amorphous silicon layer 58, or directly performing the CVD process within a doped source to form the doped amorphous silicon layer 58, for instance. The doping polarity of the doped amorphous silicon layer 58 is preferably opposite to the doping type polarity of the doped polysilicon layer 16, and the doping type polarity of one of the doped amorphous silicon layer 58 and the doped polysilicon layer 16 is the same as that of the semiconductor substrate 12. The thickness of the intrinsic amorphous silicon layer 56 may be less than or equal to about 10 nm, preferable about 5 nm. The thickness of the doped amorphous silicon layer 58 may be about 2 nm to 20 nm, preferable about 10 nm. For instance, the thickness of the doped amorphous silicon layer 58 is preferable equal to or more than two times of the thickness of the amorphous silicon layer 56, but not limited thereto.

Referring to FIG. 12, a portion of the doped amorphous silicon layer 58 is removed. For example, the portion of the doped amorphous silicon layer 58 disposed outside the trenches 54 is removed, and the remaining doped amorphous silicon layer 58 forms the doped area 32. For instance, the aforementioned removing process of the doped amorphous silicon layer 58 may be a laser ablation process, or may be carried out by using a screen printing mask or a lithography process accompanied with a dry etching process, but not limited thereto. In preferable embodiments, the doped area 32 has the same doping polarity type as the semiconductor substrate 12, and is opposite to the doping polarity type of the doped polysilicon layer 16. For example, the doped area 32 should have N+ type if the semiconductor substrate 12 is doped with N type dopants, the doped polysilicon layer 16 has P+ type, and the doped area 32 is designed to have a polarity opposite to the doped polysilicon layer 16 but the same as the semiconductor substrate 12. In contrary, the doped area 32 should has P+ type if the semiconductor substrate 12 has P type, the doped polysilicon layer 16 has N+ type, and the doped area 32 is designed to have polarity opposite to the doped polysilicon layer 16 but the same as the semiconductor substrate 12. The doped area 32 serves as the BSF device of the solar cell 10. In this situation, the existence of the intrinsic amorphous silicon layer 56 enables the doped area 32 to provide good BSF performance. Accordingly, one of the main differences between this embodiment and the first embodiment is that the solar cell 10 of this embodiment further includes an amorphous silicon layer 56 disposed between the first insulating layer 38 and the second insulating layer 40, between the side of the doped polysilicon layer 16 and the second insulating layer 40, and between the doped area 32 and the semiconductor substrate 12.

Referring to FIG. 13, similar to the first embodiment, the patterned second insulating layer 40 and the first electrode 22 and the second electrode 24 are sequentially formed on the second surface 12b of the semiconductor substrate 12, and the doped layer 14 and ARC layer 30 are formed on the first surface 12a of the semiconductor substrate 12. Preferably, the doped layer 14 has the same doping polarity type as the semiconductor substrate 12 for serving as a FSF device. As a result, the formations of the main devices of the present disclosure solar cell 10 are accomplished. The formation process, materials and film thickness of the various devices of the solar cell 10 of this embodiment may refer to the related description in the first embodiment, and will not be detailed described.

Figure 14:
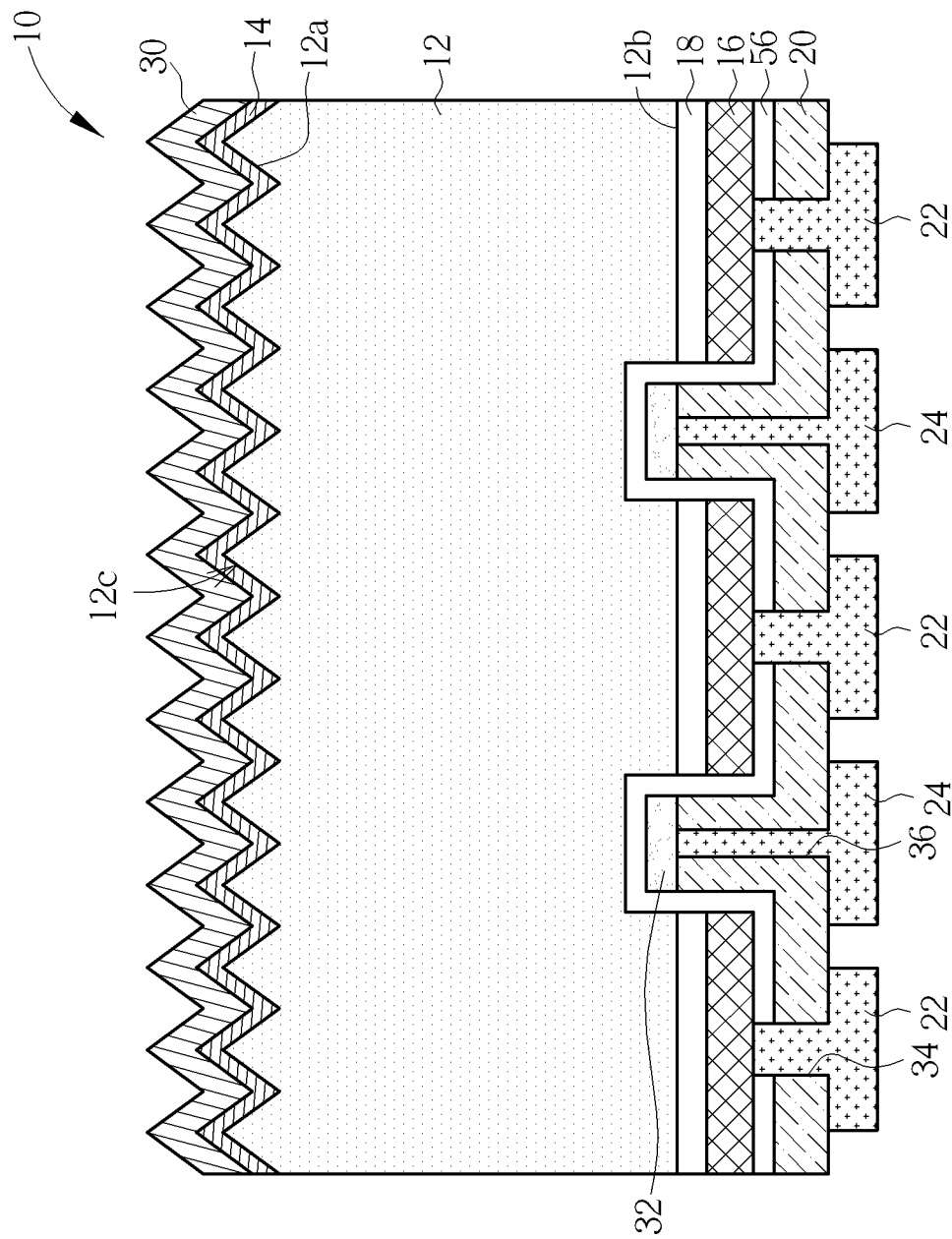
FIG. 14 is a sectional schematic diagram of a solar cell according to a fourth embodiment of the present disclosure.

Referring to FIG. 14, FIG. 14 is a schematic sectional diagram of the structure of the solar cell according to a fourth embodiment of the present disclosure. Different from the third embodiment, the solar cell 10 of this embodiment only has one single layer of insulating layer 20, which has at least one first opening 34 exposing a portion of the doped polysilicon layer 16 and at least one second opening 36 exposing a portion of the doped area 32. The first electrode 22 and the second electrode 24 are connected to the doped polysilicon layer 16 and the doped area 32 through the first opening 34 and the second opening 36 respectively. Similarly, in order to serve as a passivation layer, the material of the insulating layer 20 can be selected optionally. Taking the doped polysilicon layer 16 with $P^+$ doping type and the doped area 32 with $N^+$ doping type as an example, if the insulating layer 20 is designed for solving the problem of high saturation current of the doped polysilicon layer 16, the material with negative type of FOC maybe used to form the insulating layer 20; alternatively, if the insulating layer 20 is designed for solving the problem of high saturation current of the doped area 32, the material with positive type of FOC maybe used for the insulating layer 20. In another aspect, in the example that the doped polysilicon layer 16 has N+ type and the doped area 32 has P+ type, a material with positive type of FOC for the insulating layer 20 can be used if the saturation current of the doped polysilicon layer 16 with N+ type is the main problem to be improved; and the material with negative type of FOC of the insulating layer 20 can be used if the saturation current of the doped area 32 with P+ type needs to be improved. The materials with positive or negative types of FOC have been introduced in the description of FIG. 1, and no details will be repeated herein. The fabrication method of the solar cell 10 of this embodiment is similar to the third embodiment, only that the formation of the first insulating layer is omitted. The patterning process to the doped polysilicon layer 16 and the oxide layer 18 is carried out right after forming the doped polysilicon layer 16, to expose the semiconductor substrate 12 within the second region 28. Then, the amorphous silicon layer 56 and the doped amorphous silicon layer 58 (as shown in FIG. 11) are successively formed, and the doped amorphous silicon layer 58 is patterned to form the doped area 32. After that, the insulating layer 20 is formed and patterned to form the first opening 34 and the second opening 36. The thickness of the insulating layer 20 may be about 20 nm to about 500 nm. The details of the formation process of each device will not be repeated herein.

It is noteworthy that the doping types of the various devices, the FOC polarities of the first and second insulating layers, and their relative relationships in the second embodiment to the fourth embodiment of the present disclosure solar cells are not limited to only one combination and may be various, as described in the first embodiment. Preferably, the semiconductor substrate and the doped layer have the same doping types, one of the doped polysilicon layer and the doped area has the same polarity of doping type as the semiconductor substrate, and the other one of the doped polysilicon layer and the doped area has an opposite polarity of doping type.

More preferably, the polarity of the doping type of the doped polysilicon layer is opposite to that of the semiconductor substrate, the polarity type of FOC of the first insulating layer is opposite to the doped polysilicon layer, and the polarity of FOC of the second insulating layer is opposite to the doped area, and the materials of the first and second insulating layers are selected accordingly, but not limited thereto. If only one single insulating layer is formed, the polarity of FOC of the insulating layer can be designed in accordance with which doped device should be passivated, but not limited thereto. When the doping type of the doped device is opposite to the polarity type of FOC of the insulating layer, the insulating layer can provide field effect passivation functionality to the doped device. The dopants of each doped devices, the materials of the insulating layer(s) and the formation sequences of the devices on the front or rear sides of the solar cell have been introduced in the first embodiment, thus will not be repeated herein.

It is an advantage that the anode and cathode of the present disclosure solar cell are all disposed on the second surface of the semiconductor substrate, which is the rear side of the solar cell and in contrary to the light-receiving side, such that the light entering amount can be increased. In preferable embodiments, a FSF device and a BSF device are disposed on the front side and the rear side of the solar cell respectively, and the doped polysilicon layer serves as the emitter, such that the photoelectric conversion efficiency can be effectively raised. Furthermore, one or several doped insulating layers are disposed on the surfaces of the polysilicon layer and the doped area, such as two insulating layers with FOC polarities opposite to each other, for providing field effect passivation functionality to the doped polysilicon layer and the doped area individually, so as to decrease the recombination current. As a result, the structure and fabrication method of the present disclosure solar cell can effectively improve the whole photoelectric conversion efficiency of the solar cell.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A method for making a solar cell, comprising:
   providing a semiconductor substrate, having a first surface and a second surface, wherein the second surface has a first region and a second region and the semiconductor substrate has a first doping type;
   forming a doped polysilicon layer in the first region on the second surface of the semiconductor substrate, exposing the second region of the second surface of the semiconductor substrate;
   forming at least one doped area in the exposed second region of the second surface of the semiconductor substrate, wherein one of the doped polysilicon layer and the doped area has a second doping type, the other one of the doped polysilicon layer and the doped area has the first doping type, and the second doping type is opposite to the first doping type;
   forming an insulating layer to cover and being disposed on the doped polysilicon layer and the doped area, the insulating layer having at least one first opening exposing a portion of the doped polysilicon layer and at least one second opening exposing a portion of the doped area;
   forming a metal layer on the insulating layer with the first and second openings, the metal layer including:
      at least one first electrode, connected to the doped polysilicon layer through the first opening; and
      at least one second electrode, connected to the doped area through the second opening; and
   forming a doped layer to cover and being disposed on the first surface of the semiconductor substrate to cover the first surface, wherein the doped layer has the first doping type.

2. The method for making the solar cell of claim 1, further comprising forming an oxide layer disposed between the second region of the second surface of the semiconductor substrate and the doped polysilicon layer before forming the doped polysilicon layer.

3. The method for making the solar cell of claim 1, wherein the step of forming the insulating layer with the first opening exposing the portion of the doped polysilicon layer and the second opening exposing the portion of the doped area and covering the surfaces of the doped polysilicon layer and the doped area includes:
   forming a first insulating layer disposed on the surface of the doped polysilicon layer, the first insulating layer having a first sub-opening that exposes the portion of the doped polysilicon layer and a second sub-opening that exposes at least one portion of the doped area; and
   forming a second insulating layer, covering and disposed on the first insulating layer and the doped area and having a third sub-opening corresponding to the first sub-opening, exposing the portion of the doped polysilicon layer, and a fourth sub-opening corresponding to the second sub-opening, exposing the portion of the doped area;
   wherein the first insulating layer and the second insulating layer are composed of different materials, the first sub-opening and the third sub-opening compose the first opening, and the second sub-opening and the fourth sub-opening compose the second opening.

4. The method for making the solar cell of claim 3, wherein a polarity of a fixed oxide charge (FOC) of the first insulating layer is opposite to a polarity of the FOC of the second insulating layer.

5. The method for making the solar cell of claim 4, wherein the polarity of the FOC of the first insulating layer is opposite to the second doping type and the polarity of the FOC of the second insulating layer is opposite to the first doping type when the doped area has the first doping type and the doped polysilicon layer has the second doping type.

6. The method for making the solar cell of claim 4, wherein the polarity of the FOC of the first insulating layer is opposite to the first doping type and the polarity of the FOC of the second insulating layer is opposite to the second doping type when the doped polysilicon layer has the first doping type and the doped area has the second doping type.

7. The method for making the solar cell of claim 3, further comprising forming an amorphous silicon layer before forming the doped area, the amorphous silicon layer being disposed between the first insulating layer and the second insulating layer, between a side of the doped polysilicon layer and the second insulating layer, and between the doped area and the semiconductor substrate.

8. The method for making the solar cell of claim 1, further comprising forming a trench in the second region of the second surface of the semiconductor substrate, wherein the doped area is formed in the trench.

9. The method for making the solar cell of claim 8, further comprising forming an amorphous silicon layer before forming the doped area, the amorphous silicon layer being disposed between the doped polysilicon layer and the insulating layer and between the doped area and the semiconductor substrate.

10. The method for making the solar cell of claim 1, wherein the doped area is a doped amorphous silicon layer.

11. The method for making the solar cell of claim 1, further comprising forming an ARC layer on the first surface of the semiconductor substrateto cover the doped layer.

* * * * *